(12) United States Patent
Genda et al.

(10) Patent No.: US 7,915,140 B2
(45) Date of Patent: Mar. 29, 2011

(54) FABRICATION METHOD FOR DEVICE HAVING DIE ATTACH FILM ON THE BACK SIDE THEREOF

(75) Inventors: Satoshi Genda, Ota-Ku (JP); Nobuyasu Kitahara, Ota-Ku (JP)

(73) Assignee: Disco Corporation, Tokyo (JP)

( * ) Notice: Subject to any disclaimer, the term of this patent is extended or adjusted under 35 U.S.C. 154(b) by 81 days.

(21) Appl. No.: 12/430,576

(22) Filed: Apr. 27, 2009

(65) Prior Publication Data
US 2009/0280622 A1 Nov. 12, 2009

(30) Foreign Application Priority Data
May 7, 2008 (JP) .................................. 2008-121144

(51) Int. Cl.
*H01L 21/46* (2006.01)
*H01L 21/78* (2006.01)
*H01L 21/301* (2006.01)

(52) U.S. Cl. .................. 438/462; 438/464; 257/E21.237

(58) Field of Classification Search .................. 438/462, 438/464; 257/E21.237
See application file for complete search history.

(56) References Cited

U.S. PATENT DOCUMENTS
| 7,494,900 | B2 * | 2/2009 | Harris et al. | .................. 438/460 |
| 7,622,366 | B2 * | 11/2009 | Nakamura | .................... 438/463 |
| 2004/0266138 | A1 * | 12/2004 | Kajiyama et al. | ............. 438/462 |

FOREIGN PATENT DOCUMENTS
JP  A 2000-182995  6/2000
JP  A 2002-118081  4/2002

* cited by examiner

*Primary Examiner* — Phuc T Dang
(74) *Attorney, Agent, or Firm* — Greer, Burns & Crain, Ltd.

(57) ABSTRACT

A device fabrication method for fabricating individual devices from a wafer, wherein the back side of each device is covered with an adhesive film for die bonding. The device fabrication method includes a wafer dividing step of dividing the wafer into the individual devices along a plurality of kerfs by using a dicing before grinding process, an adhesive film mounting step of mounting an adhesive film on the back side of the wafer after performing the wafer dividing step, and an adhesive film dividing step of applying a laser beam to the adhesive film along the kerfs after performing the adhesive film mounting step, thereby dividing the adhesive film along the kerfs.

1 Claim, 10 Drawing Sheets

FABRICATION METHOD FOR DEVICE HAVING DIE ATTACH FILM ON THE BACK SIDE THEREOF

BACKGROUND OF THE INVENTION

1. Field of the Invention

The present invention relates to a device fabrication method for dividing a wafer into individual devices along a plurality of crossing streets formed on the front side of the wafer, wherein the devices are respectively formed in a plurality of regions partitioned by the streets and the back side of each device is covered with an adhesive film for die bonding.

2. Description of the Related Art

In a semiconductor device fabrication process, a plurality of crossing streets (division lines) are formed on the front side of a substantially disk-shaped semiconductor wafer to partition a plurality of regions where devices such as ICs and LSIs are respectively formed, and these regions are separated from each other along the streets to thereby produce the individual devices. As a dividing apparatus for dividing the semiconductor wafer into the individual devices, a cutting apparatus called a dicing apparatus is generally used. The cutting apparatus includes a cutting blade having a thickness of tens of micrometers for cutting the semiconductor wafer along the streets. The devices thus obtained are packaged to be widely used in electric equipment such as mobile phones and personal computers.

An adhesive film for die bonding called a die attach film having a thickness of 20 to 40 µm is mounted on the back side of each device, and each device is bonded through the adhesive film to a die bonding frame for supporting the device by heating. The adhesive film is formed of epoxy resin, for example. The adhesive film for die bonding is mounted on the back side of each device by a method including the steps of attaching an adhesive film to the back side of a semiconductor wafer, attaching the semiconductor wafer through the adhesive film to a dicing tape, and cutting the adhesive film with the semiconductor wafer along the streets formed on the front side of the semiconductor wafer by a cutting blade, thereby forming the individual devices, wherein the adhesive film is mounted on the back side of each device (see Japanese Patent Laid-open No. 2000-182995, for example).

In recent years, it has been desired to further reduce the weight and size of electric equipment such as mobile phones and personal computers, so that thinner devices have been required. As a technique of dividing a wafer into thinner devices, a so-called dicing before grinding process has been put to practical use. This dicing before grinding process includes the steps of forming a kerf (dividing groove) having a predetermined depth (corresponding to the finished thickness of each device) along each street on the front side of a semiconductor wafer and next grinding the back side of the semiconductor wafer to expose each kerf to the back side of the semiconductor wafer, thereby dividing the semiconductor wafer into the individual devices. By this dicing before grinding process, the thickness of each device can be reduced to 50 µm or less.

However, in the case of dividing the semiconductor wafer into the individual devices by the dicing before grinding process, the kerf having a predetermined depth is formed along each street on the front side of the semiconductor wafer and the back side of the semiconductor wafer is next ground to expose each kerf to the back side of the semiconductor wafer. Accordingly, an adhesive film for die bonding cannot be preliminarily mounted on the back side of the semiconductor wafer. Therefore, in bonding each device fabricated by the dicing before grinding process to the die bonding frame, a bonding agent must be inserted between each device and the die bonding frame. As a result, a bonding operation cannot be smoothly performed.

To solve this problem, there has been proposed a semiconductor device fabrication method including the steps of mounting an adhesive film for die bonding to the back side of a semiconductor wafer divided into individual devices by a dicing before grinding process, attaching the semiconductor wafer through the adhesive film to a dicing tape, and applying a laser beam from the front side of the semiconductor wafer through the spacing between the adjacent devices to the adhesive film, thereby melting and dividing the adhesive film along the spacing between the adjacent devices to obtain individual adhesive films respectively mounted on the individual devices (see Japanese Patent Laid-open No. 2002-118081, for example).

According to the technique disclosed in Japanese Patent Laid-open No. 2002-118081 mentioned above, the laser beam is applied from the front side of the semiconductor wafer to the adhesive film mounted on the back side of the semiconductor wafer through each kerf formed by a cutting blade having a thickness of tens of micrometers, thereby melting and dividing the adhesive film at its portion exposed to the spacing between the adjacent devices. Accordingly, it is difficult to melt and divide only the adhesive film along each kerf without applying the laser beam to the front side of each device. Furthermore, in the step of attaching the semiconductor wafer divided into the individual devices through the adhesive film to the dicing tape, there is a possibility of meandering of each kerf, causing the difficulty of application of the laser beam along each kerf. Thus, the semiconductor device fabrication method disclosed in Japanese Patent Laid-open No. 2002-118081 mentioned above has a problem such that the laser beam may cause damage to the front side of each device.

Further, the technique disclosed in Japanese Patent Laid-open No. 2002-118081 has another problem such that the adhesive film is melted by the laser beam to cause adhesion to the dicing tape. Accordingly, there is a possibility that each device with the accompanying adhesive film cannot be peeled off from the dicing tape in a pickup step.

SUMMARY OF THE INVENTION

It is therefore an object of the present invention to provide a device fabrication method which can easily mount an adhesive film for die bonding on the back side of a wafer divided into individual devices by a dicing before grinding process, can cut the adhesive film without causing damage to each device, and can reliably pick up each device with the accompanying adhesive film.

In accordance with an aspect of the present invention, there is provided a device fabrication method for dividing a wafer into individual devices along a plurality of crossing streets formed on the front side of the wafer, wherein the devices are respectively formed in a plurality of regions partitioned by the streets and the back side of each device is covered with an adhesive film for die bonding, the device fabrication method including a kerf forming step of cutting the front side of the wafer along the streets by using a cutting blade to thereby form a plurality of kerfs along the streets, each kerf having a depth corresponding to the finished thickness of each device; a protective tape attaching step of attaching a protective tape to the front side of the wafer after performing the kerf forming step; a wafer dividing step of grinding the back side of the wafer to expose each kerf to the back side of the wafer after performing the protective tape attaching step, thereby dividing the wafer into the individual devices; an adhesive film mounting step of mounting an adhesive film on the back side of the wafer after performing the wafer dividing step; an adhesive film dividing step of applying a laser beam to the adhesive film along the kerfs after performing the adhesive film mounting step, thereby dividing the adhesive film along the kerfs; a wafer supporting step of attaching the adhesive film mounted on the back side of the wafer to a dicing tape supported to an annular frame and peeling off the protective tape from the front side of the wafer after performing the adhesive film dividing step; and a pickup step of peeling off each device with the accompanying adhesive film from the dicing tape.

In the adhesive film dividing step of the device fabrication method according to the present invention, the protective tape is kept attached to the front side of the wafer divided into the individual devices. Accordingly, meandering of each kerf can be prevented, so that the laser beam can be accurately applied to the adhesive film along each kerf. Accordingly, there is no possibility that the laser beam may be deviated from each kerf to cause damage to the devices.

The individual adhesive films are attached to the dicing tape supported to the annular frame after the adhesive film dividing step. Accordingly, there is no possibility that the adhesive films may adhere to the dicing tape, so that each device with the accompanying adhesive film can be easily peeled off from the dicing tape in the pickup step.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
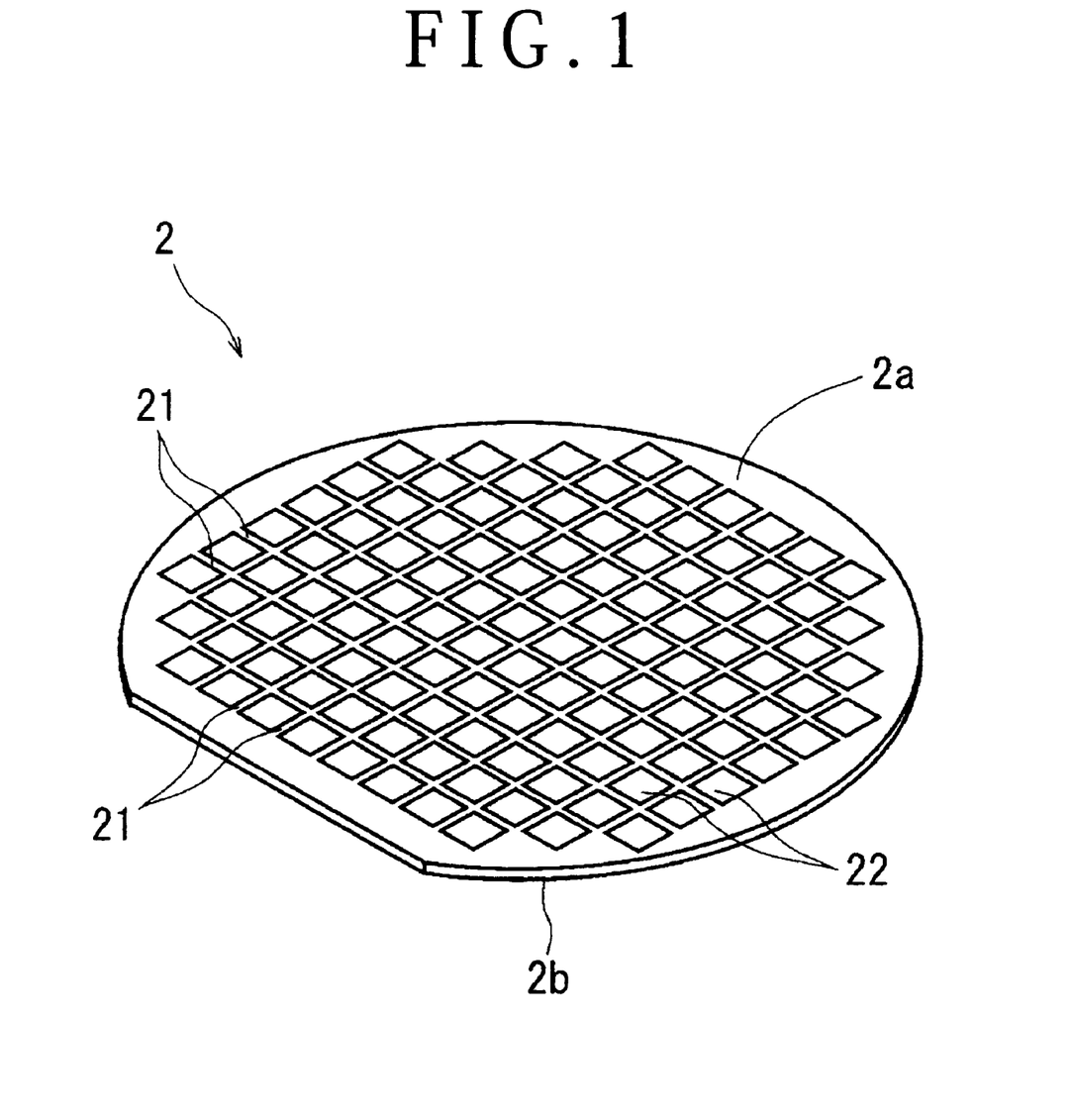
FIG. 1 is a perspective view showing a semiconductor wafer as a wafer.

A preferred embodiment of the device fabrication method according to the present invention will now be described in detail with reference to the attached drawings. FIG. 1 shows a perspective view of a semiconductor wafer 2 as a wafer. For example, the semiconductor wafer 2 shown in FIG. 1 is a silicon wafer having a thickness of 600 μm. A plurality of crossing streets 21 are formed on the front side 2a of the semiconductor wafer 2, thereby partitioning a plurality of rectangular areas in which a plurality of devices 22 such as ICs and LSIs are respectively formed. The procedure of dividing the semiconductor wafer 2 into the individual devices 22 by a dicing before grinding process will now be described.

In the dicing before grinding process for dividing the semiconductor wafer 2 into the individual devices 22, a kerf forming step is first performed in such a manner that the front side 2a of the semiconductor wafer 2 is cut along each street 21 by using a cutting blade to thereby form a kerf having a depth corresponding to the finished thickness of each device 22. This kerf forming step is performed by using a cutting apparatus 3 shown in FIG. 2A. The cutting apparatus 3 shown in FIG. 2A includes a chuck table 31 for holding the semiconductor wafer 2 as a workpiece, cutting means 32 for cutting the semiconductor wafer 2 held on the chuck table 31, and imaging means 33 for imaging the semiconductor wafer 2 held on the chuck table 31. The chuck table 31 is so configured as to hold the semiconductor wafer 2 by suction. The chuck table 31 is movable in a feeding direction shown by an arrow X in FIG. 2A by a feeding mechanism (not shown) and also movable in an indexing direction shown by an arrow Y in FIG. 2A by an indexing mechanism (not shown).

The cutting means 32 includes a spindle housing 321 extending substantially horizontally, a rotating spindle 322 rotatably supported to the spindle housing 321, and a cutting blade 323 mounted on the front end of the rotating spindle 322. The rotating spindle 322 is rotationally driven in the direction shown by an arrow 322a in FIG. 2A by a servo motor (not shown) provided in the spindle housing 321. The imaging means 33 is mounted on the front end portion of the spindle housing 321. The imaging means 33 includes illuminating means for illuminating the semiconductor wafer 2, an optical system for capturing a subject area of the semiconductor wafer 2 illuminated by the illuminating means, and an imaging device (CCD) for imaging this subject area captured by the optical system. An image signal output from the imaging means 33 is transmitted to control means (not shown).

Figure 2A:
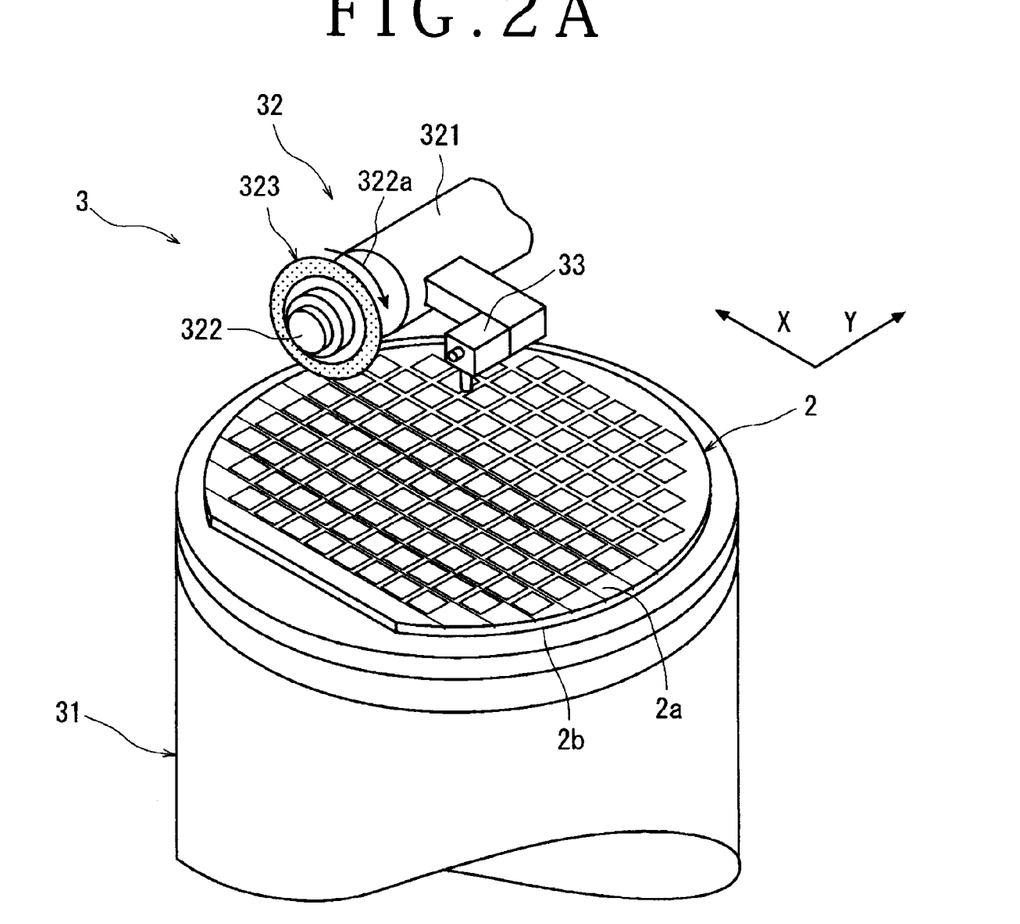
FIG. 2A is a perspective view showing a cutting apparatus for performing a kerf forming step in the device fabrication method according to the present invention.

In performing the kerf forming step by using the cutting apparatus 3, the semiconductor wafer 2 is placed on the chuck table 31 in the condition where the front side 2a of the semiconductor wafer 2 is oriented upward. By operating suction means (not shown), the semiconductor wafer 2 is held on the chuck table 31 under suction. The chuck table 31 thus holding the semiconductor wafer 2 is positioned directly below the imaging means 33 by the feeding mechanism (not shown).

When the chuck table 31 is positioned directly below the imaging means 33, an alignment operation is performed by the imaging means 33 and the control means (not shown) to detect a cutting area where a kerf is to be formed along each street 21 of the semiconductor wafer 2. More specifically, the imaging means 33 and the control means (not shown) perform image processing such as pattern matching for making the alignment between some of the streets 21 extending in a predetermined first direction on the semiconductor wafer 2 and the cutting blade 323, thereby performing the alignment in the cutting area. Similarly, the imaging means 33 and the control means (not shown) perform the alignment in a cutting area for the other streets 21 extending in a second direction perpendicular to the first direction on the semiconductor wafer 2.

Figure 2B:
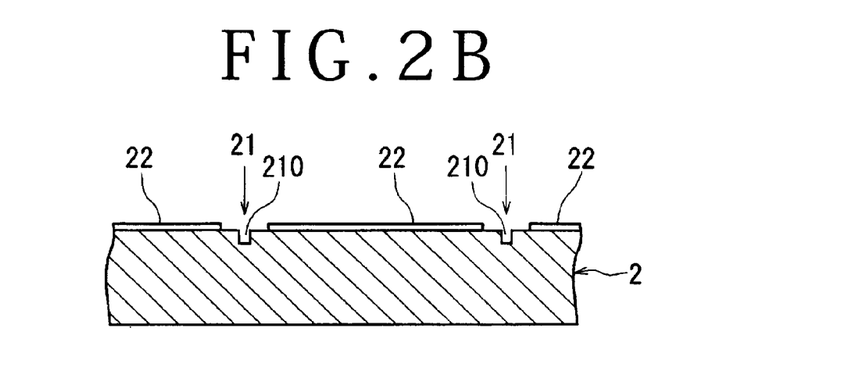
FIG. 2B is a sectional view of the semiconductor wafer obtained by the kerf forming step.

After performing such an alignment operation for detecting the cutting area on the semiconductor wafer 2 held on the chuck table 31, the chuck table 31 holding the semiconductor wafer 2 is moved to a cutting start position in the cutting area. At this cutting start position, the cutting blade 323 is rotated in the direction shown by the arrow 322a in FIG. 2A and simultaneously moved downward to perform an in-feed operation by a predetermined amount. This in-feed amount is set to the depth (e.g., 50 μm) from the front side 2a of the semiconductor wafer 2 corresponding to the finished thickness of each device 22. After performing the in-feed operation of the cutting blade 323, the chuck table 31 is moved in the direction shown by the arrow X in FIG. 2A as rotating the cutting blade 323, thereby forming a kerf 210 having a depth (e.g., 50 μm) corresponding to the finished thickness of each device 22 along each street 21 extending in the X direction as shown in FIG. 2B (kerf forming step). This kerf forming step is performed along all of the streets 21 formed on the semiconductor wafer 2.

Figure 3A:
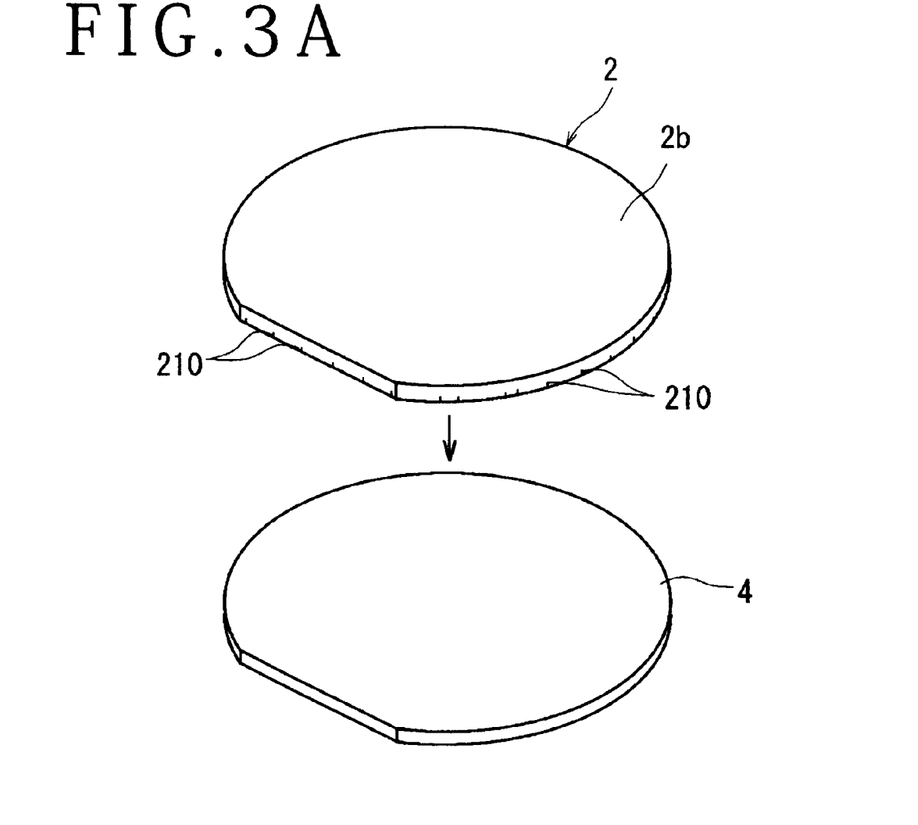
FIGS. 3A and 3B are perspective views for illustrating a protective tape attaching step in the device fabrication method according to the present invention.
Figure 3B:
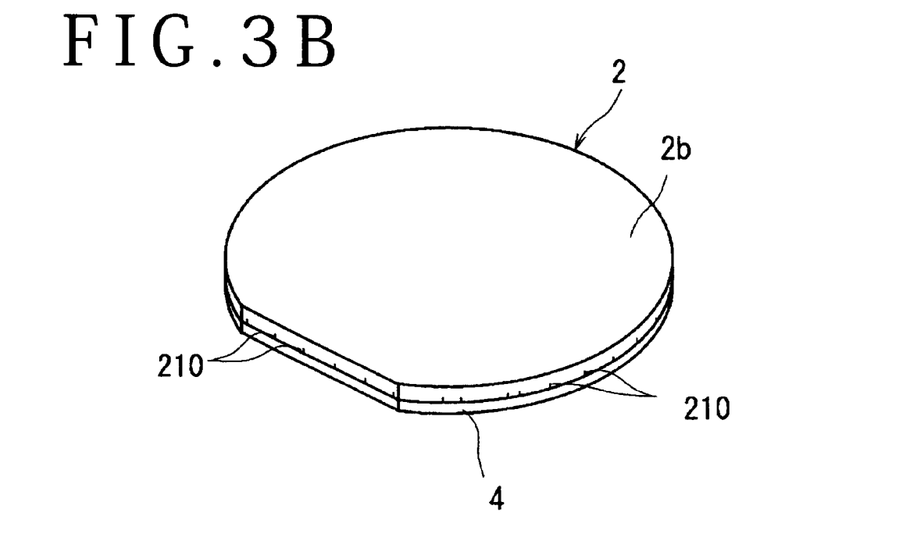

After performing the kerf forming step to form the kerf 210 having the depth corresponding to the finished thickness of each device 22 along each street 21 on the front side 2a of the semiconductor wafer 2, a protective tape 4 for use in grinding is attached to the front side 2a (on which the devices 22 are formed) of the semiconductor wafer 2 as shown in FIGS. 3A and 3B (protective tape attaching step). As the protective tape 4, a polyolefin sheet having a thickness of 150 μm is used, for example.

Figure 4A:
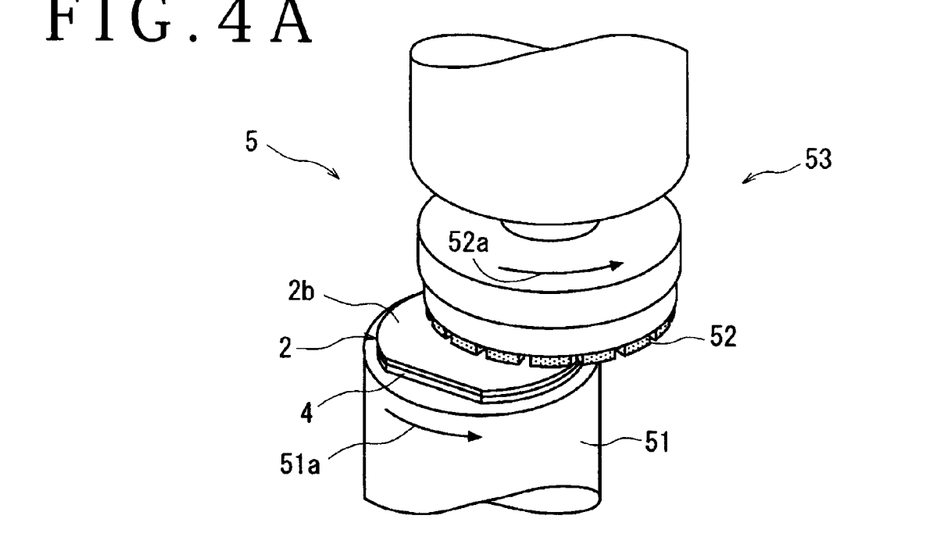
FIG. 4A is a perspective view showing a grinding apparatus for performing a wafer dividing step in the device fabrication method according to the present invention.

After performing the protective tape attaching step to cover the front side 2a of the semiconductor wafer 2 with the protective tape 4, a wafer dividing step is performed in such a manner that the back side 2b of the semiconductor wafer 2 whose front side 2a is covered with the protective tape 4 is ground until each kerf 210 is exposed to the back side 2b, thereby dividing the semiconductor wafer 2 into the individual devices 22. This wafer dividing step is performed by using a grinding apparatus 5 shown in FIG. 4A. The grinding apparatus 5 shown in FIG. 4A includes a chuck table 51 for holding the semiconductor wafer 2 as a workpiece and grinding means 53 having a grinding wheel 52 for grinding the back side 2b of the semiconductor wafer 2 held on the chuck table 51. In performing the wafer dividing step by using the grinding apparatus 5, the semiconductor wafer 2 is placed on the chuck table 51 in the condition where the back side 2b of the semiconductor wafer 2 is oriented upward. By operating suction means (not shown), the semiconductor wafer 2 is held on the chuck table 51 under suction.

Figure 4B:
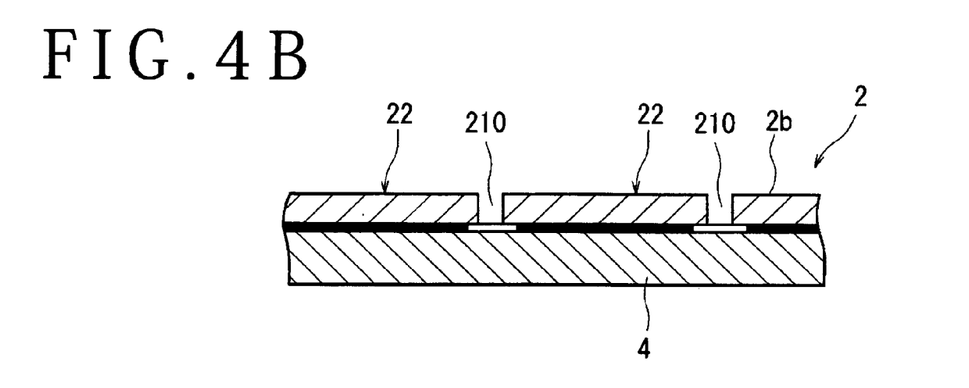
FIG. 4B is a sectional view of the semiconductor wafer obtained by the wafer dividing step.
Figure 4C:
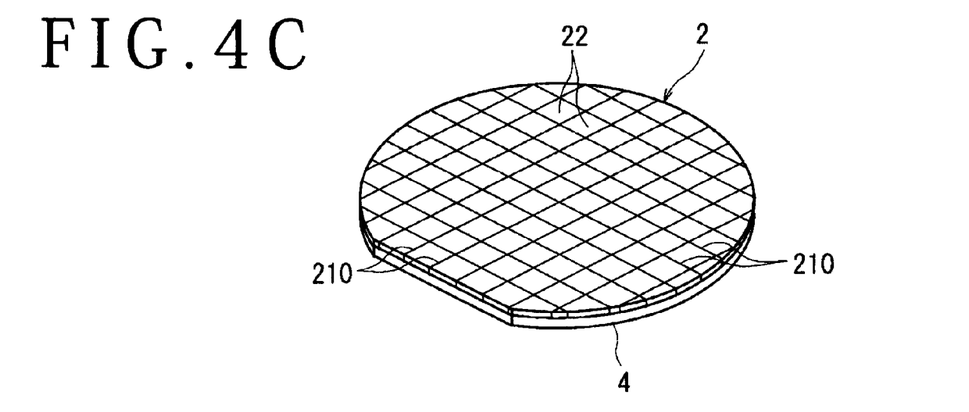
FIG. 4C is a perspective view of the semiconductor wafer obtained by the wafer dividing step.

In this condition, the chuck table 51 is rotated in the direction shown by an arrow 51a at 300 rpm, for example, and the grinding wheel 52 of the grinding means 53 is rotated in the direction shown by an arrow 52a at 6000 rpm, for example. Then, the grinding wheel 52 being rotated is brought into contact with the back side 2b of the semiconductor wafer 2 being rotated, thereby grinding the back side 2b of the semiconductor wafer 2. This grinding is performed until each kerf 210 is exposed to the back side 2b of the semiconductor wafer 2 as shown in FIG. 4B. By grinding the back side 2b of the semiconductor wafer 2 until each kerf 210 is exposed as mentioned above, the semiconductor wafer 2 is divided into the individual devices 22 as shown in FIG. 4C. In the condition shown in FIG. 4C, the protective tape 4 is kept attached to the front side 2a of the semiconductor wafer 2, so that the individual devices 22 are supported to the protective tape 4 so as to still maintain the form of the semiconductor wafer 2.

Figure 5A:
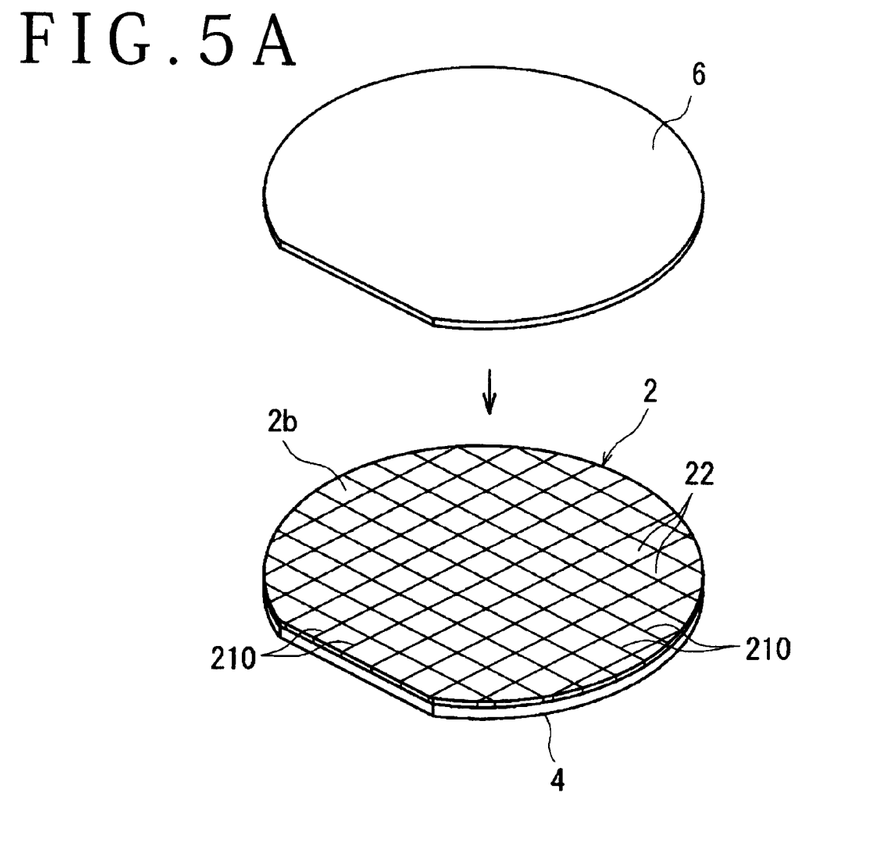
FIGS. 5A and 5B are perspective views for illustrating an adhesive film mounting step in the device fabrication method according to the present invention.
Figure 5B:
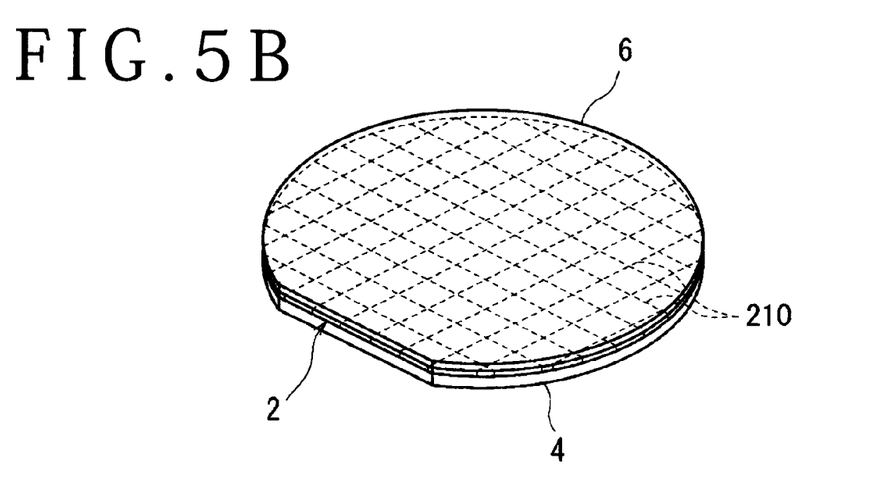

After performing the wafer dividing step by the dicing before grinding process to divide the semiconductor wafer 2 into the individual devices 22, an adhesive film mounting step is performed in such a manner that an adhesive film 6 for die bonding is mounted to the back side 2b of the semiconductor wafer 2 divided into the individual devices 22 as shown in FIGS. 5A and 5B. More specifically, the adhesive film 6 is attached to the back side 2b of the semiconductor wafer 2 under pressure at a temperature of 80 to 200° C.

After performing the adhesive film mounting step to mount the adhesive film 6 for die bonding to the back side 2b of the semiconductor wafer 2, an adhesive film dividing step is performed in such a manner that a laser beam is applied to the adhesive film 6 from the adhesive film 6 side along each kerf 210 to thereby divide the adhesive film 6 along each kerf 210. This adhesive film dividing step is performed by using a laser processing apparatus 7 shown in FIG. 6. The laser processing apparatus 7 shown in FIG. 6 includes a chuck table 71 for holding the semiconductor wafer 2 with the adhesive film 6 as a workpiece, laser beam applying means 72 for applying a laser beam to the adhesive film 6 mounted on the semiconductor wafer 2 held on the chuck table 71, and imaging means 73 for imaging the semiconductor wafer 2 held on the chuck table 71. The chuck table 71 is so configured as to hold the semiconductor wafer 2 by using suction means (not shown). The chuck table 71 is movable both in a feeding direction shown by an arrow X in FIG. 6 by a feeding mechanism (not shown) and in an indexing direction shown by an arrow Y in FIG. 6 by an indexing mechanism (not shown).

Figure 6:
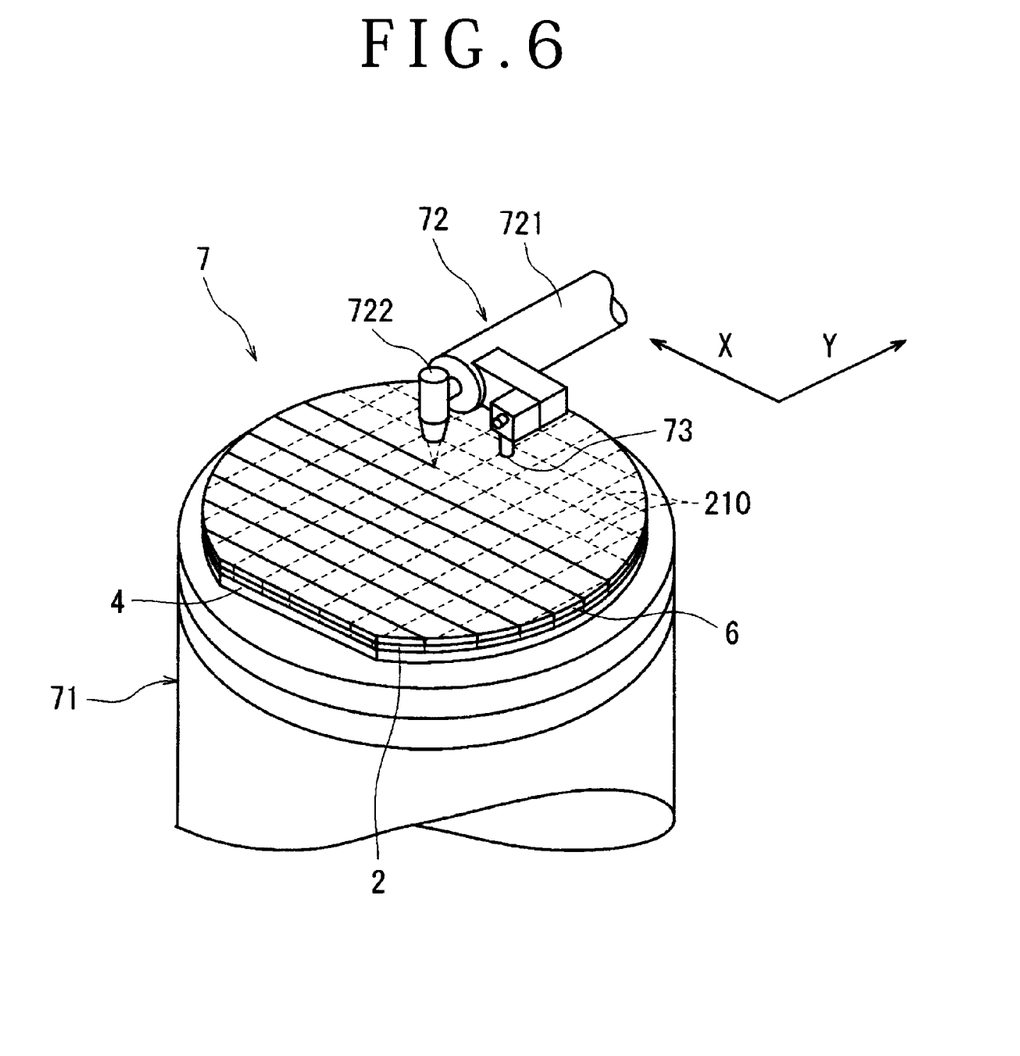
FIG. 6 is a perspective view showing a laser processing apparatus for performing an adhesive film dividing step in the device fabrication method according to the present invention.

The laser beam applying means 72 includes a cylindrical casing 721 extending in a substantially horizontal direction. Although not shown, the casing 721 contains pulsed laser beam oscillating means including a pulsed laser beam oscillator and repetition frequency setting means. Examples of the pulsed laser beam oscillator include a YAG laser oscillator and an YVO4 laser oscillator. The laser beam applying means 72 further includes focusing means 722 mounted on the front end of the casing 721 for focusing the pulsed laser beam oscillated from the pulsed laser beam oscillating means.

The imaging means 73 is mounted on the front end portion of the casing 721 of the laser beam applying means 72. The imaging means 73 includes an ordinary imaging device (CCD) for imaging the semiconductor wafer 2 by using visible light, infrared light applying means for applying infrared light to the semiconductor wafer 2, an optical system for capturing the infrared light applied to the semiconductor wafer 2 by the infrared light applying means, and an imaging device (infrared CCD) for outputting an electrical signal corresponding to the infrared light captured by the optical system. An image signal output from the imaging means 73 is transmitted to the control means (not shown).

In performing the adhesive film dividing step by using the laser processing apparatus 7, the semiconductor wafer 2 is first placed on the chuck table 71 of the laser processing apparatus 7 in the condition where the adhesive film 6 mounted on the back side 2b of the semiconductor wafer 2 is oriented upward as shown in FIG. 6. Thereafter, the suction means (not shown) is operated to hold the semiconductor wafer 2 on the chuck table 71 under suction.

Thereafter, an adhesive film dividing step is performed in such a manner that a laser beam is applied from the adhesive film 6 side to the adhesive film 6 mounted on the back side 2b of the semiconductor wafer 2 along each kerf 210 to thereby divide the adhesive film 6 along each kerf 210. In performing the adhesive film dividing step, the chuck table 71 thus holding the semiconductor wafer 2 is moved to a position directly below the imaging means 73 by the feeding mechanism (not shown). In this condition, an alignment operation is performed by the imaging means 73 and the control means (not shown) to detect a subject area of the adhesive film 6 mounted on the back side 2b of the semiconductor wafer 2 to be laser-processed.

More specifically, the imaging means 73 and the control means (not shown) perform image processing such as pattern matching for making the alignment of the first kerfs 210 extending in the first direction on the semiconductor wafer 2 and the focusing means 722 of the laser beam applying means 72 for applying the laser beam to the adhesive film 6 along the first kerfs 210, thus performing the alignment of a laser beam applying position. Similarly, the alignment of a laser beam applying position is performed for the second kerfs 210 extending in the second direction perpendicular to the first direction. Although the first and second kerfs 210 are located below the adhesive film 6 in the condition shown in FIG. 6, all the kerfs 210 can be imaged through the adhesive film 6 by the imaging means 73 including the infrared light applying means, the optical system for capturing infrared light, and the imaging means (infrared CCD) for outputting an electrical signal corresponding to the infrared light as mentioned above.

Figure 7:
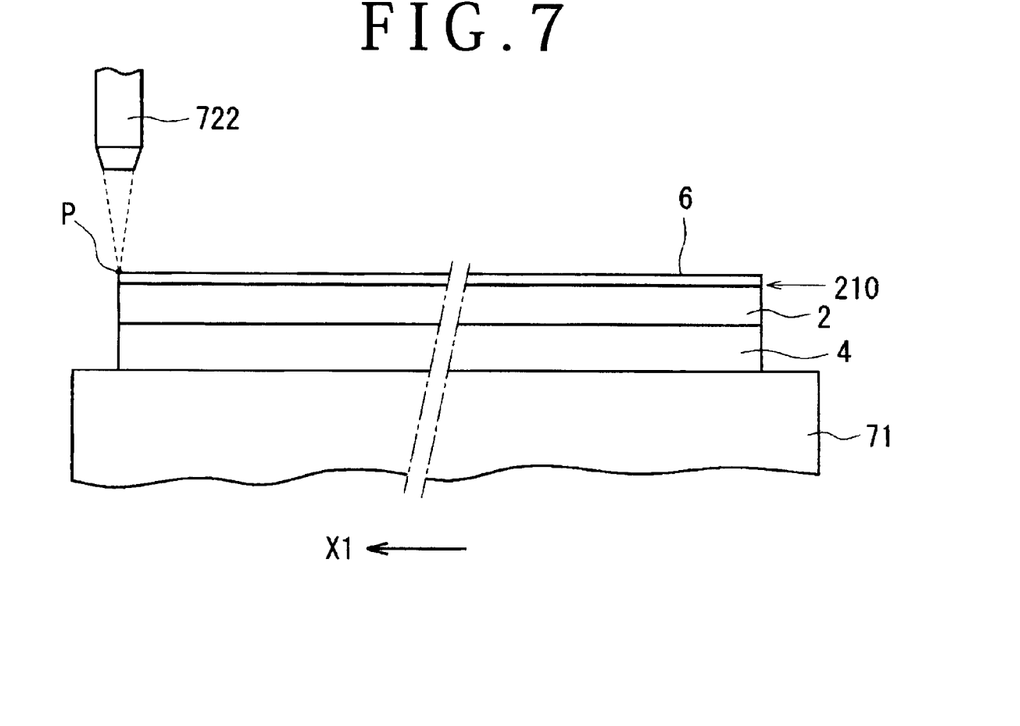
FIG. 7 is a schematic side view for illustrating the adhesive film dividing step.

After performing the alignment operation mentioned above, the chuck table 71 is moved to a laser beam applying area where the focusing means 722 of the laser beam applying means 72 is located as shown in FIG. 7, thereby positioning one end (left end as viewed in FIG. 7) of a predetermined one of the first kerfs 210 directly below the focusing means 722 of the laser applying means 72. In this condition, a pulsed laser beam having an absorption wavelength to the adhesive film 6 is applied from the focusing means 722 to the adhesive film 6 along the predetermined first kerf 210, and the chuck table 71 is moved in the direction shown by an arrow X1 in FIG. 7 at a predetermined feed speed. When the laser beam applying position of the focusing means 722 reaches the other end (right end as viewed in FIG. 7) of the predetermined first kerf 210, the application of the pulsed laser beam from the focusing means 722 is stopped and the movement of the chuck table 71 is also stopped. As shown in FIG. 7, the focal point P of the pulsed laser beam to be applied from the focusing means 722 of the laser beam applying means 72 is set on the upper surface of the adhesive film 6, so that the adhesive film 6 is melted and evaporated along the predetermined first kerf 210, thus dividing the adhesive film 6 along the predetermined first kerf 210.

For example, this adhesive film dividing step is performed under the following processing conditions.

Figure 8:
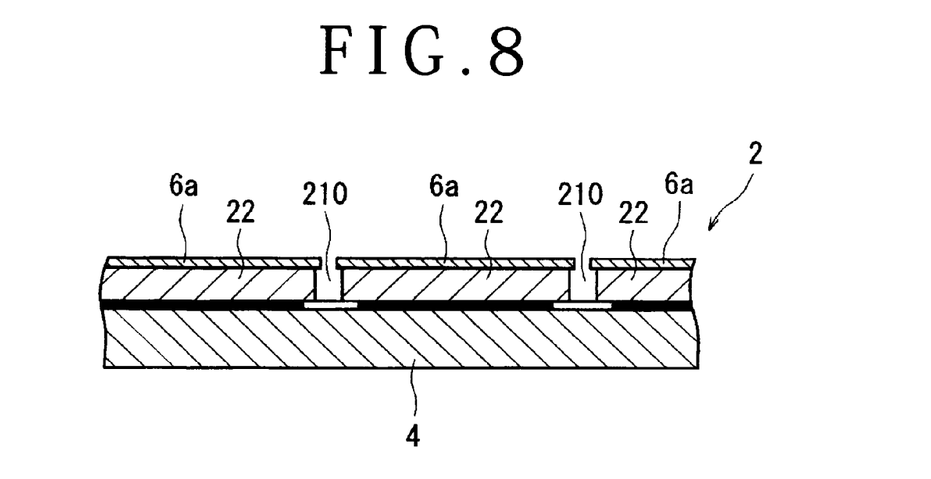
FIG. 8 is a sectional view of the semiconductor wafer obtained by the adhesive film dividing step.

Kind of laser beam: solid-state laser (YVO4 laser or YAG laser)
Wavelength: 355 nm
Repetition frequency: 50 kHz
Average power: 0.5 W
Focused spot diameter: φ 10 μm
Work feed speed: 500 mm/sec After performing the adhesive film dividing step along the predetermined first kerf 210, the chuck table 71 is moved in the indexing direction shown by the arrow Y in FIG. 6 by a predetermined amount corresponding to the spacing between the adjacent first kerfs 210, and the adhesive film dividing step mentioned above is repeated similarly for the next first kerf 210. After performing the adhesive film dividing step along all of the first kerfs 210, the chuck table 71 is rotated 90° to similarly perform the adhesive film dividing step along all of the second kerfs 210 perpendicular to the first kerfs 210. As a result, the adhesive film 6 mounted on the back side 2b of the semiconductor wafer 2 is divided into a plurality of individual adhesive films 6a respectively mounted on the individual devices 22 along all of the first and second kerfs 210 as shown in FIG. 8.

The protective tape 4 is kept attached to the front side 2a of the semiconductor wafer 2 divided into the individual devices 22 in the adhesive film dividing step. Accordingly, meandering of each kerf 210 can be prevented, so that the laser beam can be accurately applied to the adhesive film 6 along each kerf 210. Accordingly, there is no possibility that the laser beam may be deviated from each kerf 210 to cause damage to the devices 22.

Figure 9:
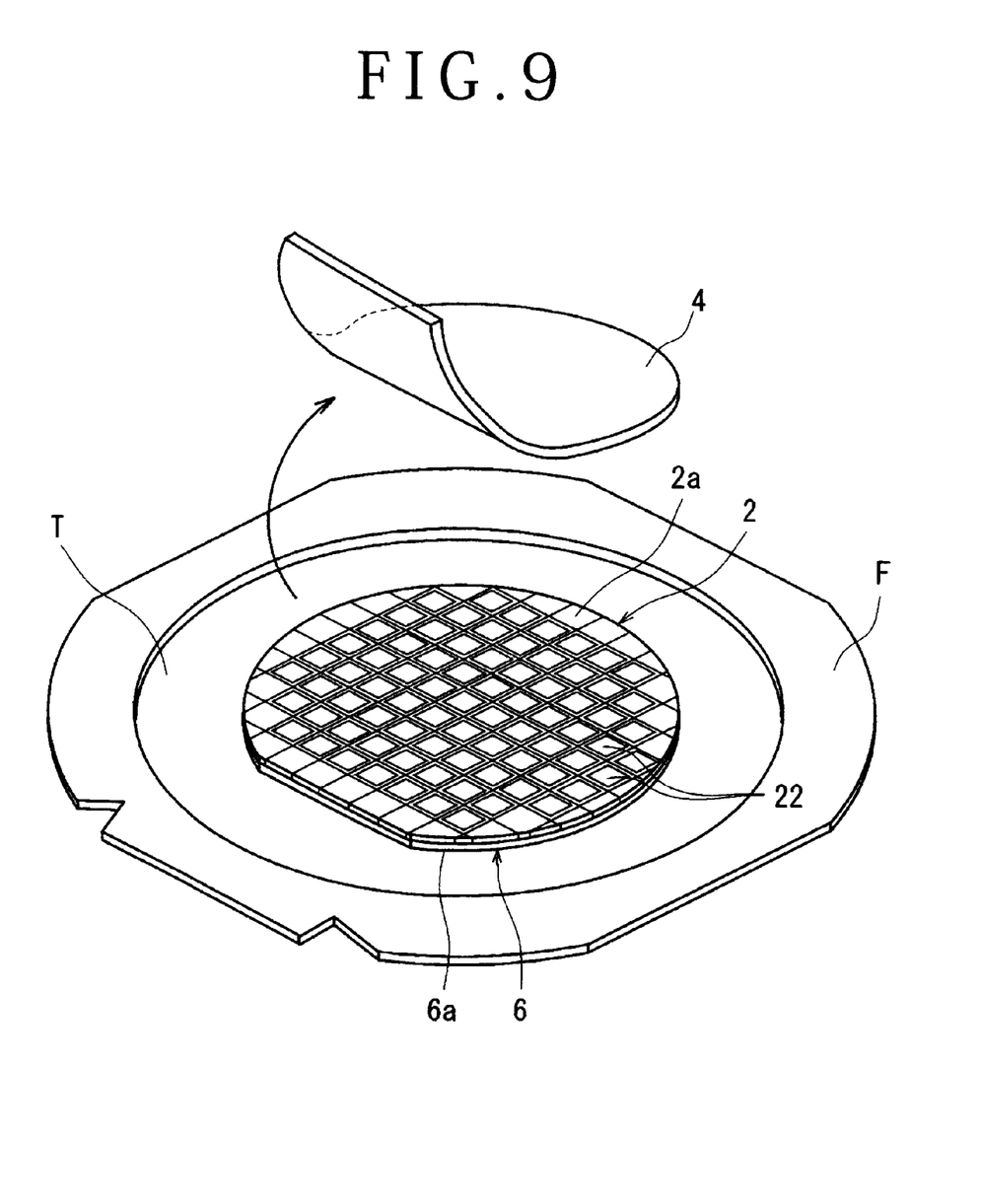
FIG. 9 is a perspective view for illustrating a wafer supporting step in the device fabrication method according to the present invention.

After performing the adhesive film dividing step to divide the adhesive film 6 into the individual adhesive films 6a along the kerfs 210 of the semiconductor wafer 2 by applying a laser beam to the adhesive film 6, a wafer supporting step is performed in such a manner that the adhesive film 6 (the individual adhesive films 6a) mounted on the back side 2b of the semiconductor wafer 2 is attached to a dicing tape T supported to an annular frame F and the protective tape 4 is peeled off from the front side 2a of the semiconductor wafer 2 as shown in FIG. 9. More specifically, as shown in FIG. 9, the dicing tape T is preliminarily supported at its peripheral portion to the annular frame F. The semiconductor wafer 2 is attached to the dicing tape T in the condition where the adhesive film 6 mounted on the back side 2b of the semiconductor wafer 2 is in contact with the upper surface of the dicing tape T. That is, the protective tape 4 attached to the front side 2a of the semiconductor wafer 2 is oriented upward. After attaching the adhesive film 6 to the dicing tape T, the protective tape 4 is peeled off from the front side 2a of the semiconductor wafer 2.

After performing the wafer supporting step, a pickup step is performed in such a manner that each device 22 with the accompanying adhesive film 6a melted and divided along each kerf 210 in the adhesive film dividing step is peeled off from the dicing tape T. This pickup step is performed by using a pickup apparatus 8 shown in FIG. 10. The pickup apparatus 8 shown in FIG. 10 includes frame holding means 81 for holding the annular frame F, tape expanding means 82 for expanding the dicing tape T supported to the annular frame F held by the frame holding means 81, and a pickup collet 83.

Figure 10:
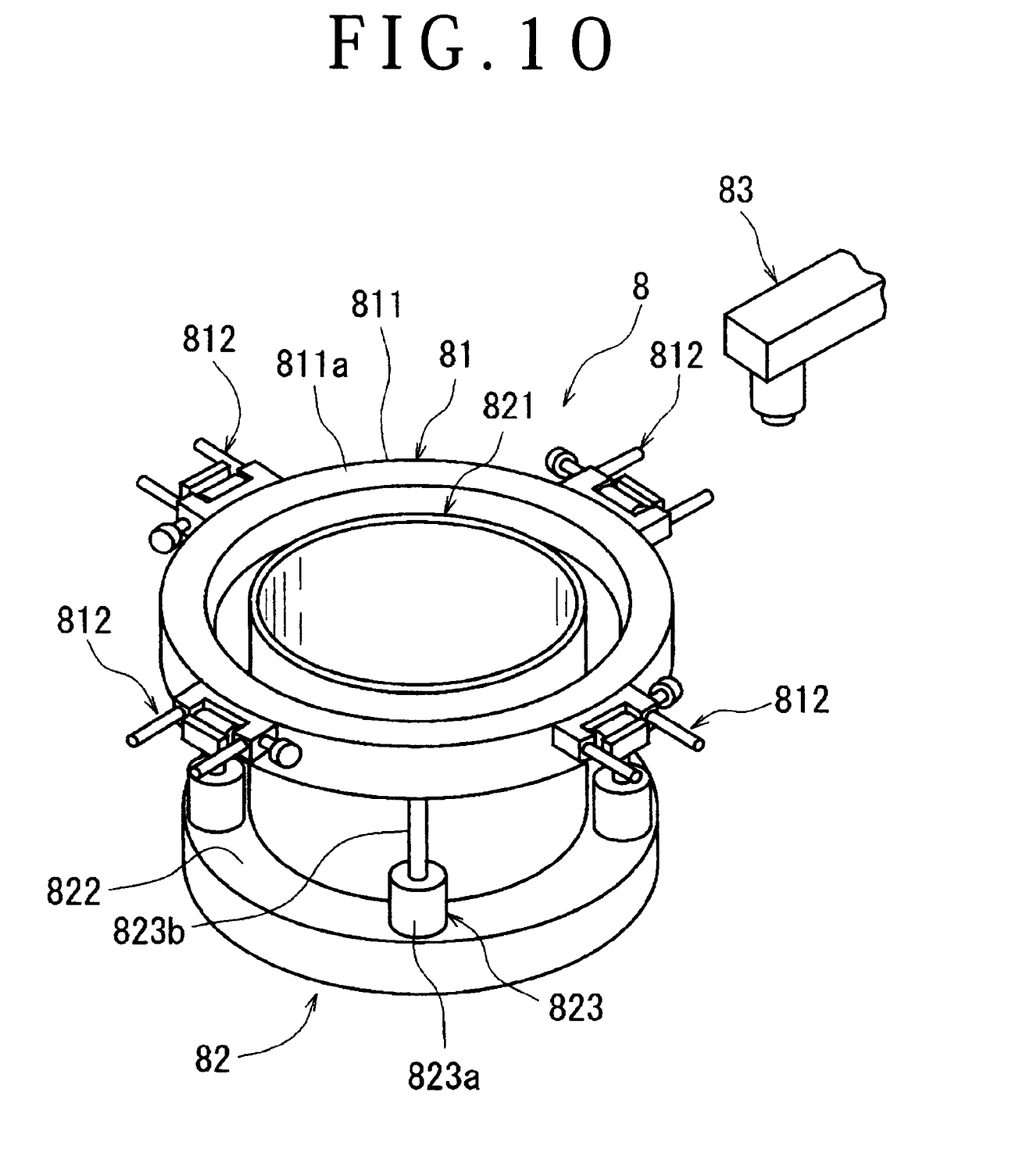
FIG. 10 is a perspective view showing a pickup apparatus for performing a pickup step in the device fabrication method according to the present invention.

The frame holding means 81 includes an annular frame holding member 811 and a plurality of clamps 812 as fixing means provided on the outer circumference of the frame holding member 811. The upper surface of the frame holding member 811 functions as a mounting surface 811a for mounting the annular frame F thereon. The annular frame F mounted on the mounting surface 811a is fixed to the frame holding member 811 by the clamps 812. The frame holding means 81 is supported by the tape expanding means 82 so as to be vertically movable.

Figure 11A:
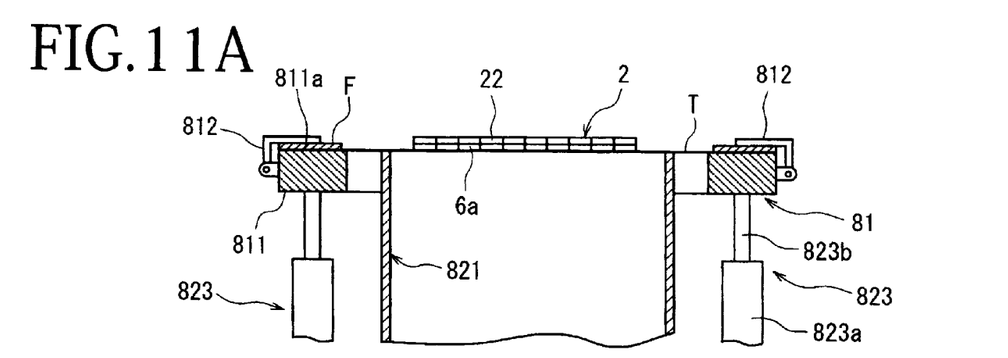
FIGS. 11A to 11C are sectional views for illustrating the pickup step.

The tape expanding means 82 includes an expanding drum 821 provided inside of the annular frame holding member 811. The expanding drum 821 has an outer diameter smaller than the inner diameter of the annular frame F and an inner diameter larger than the outer diameter of the semiconductor wafer 2 attached to the dicing tape T supported to the annular frame F. The expanding drum 821 has a supporting flange 822 at the lower end of the drum 821. The tape expanding means 82 further includes driving means 823 for vertically moving the annular frame holding member 811. The driving means 823 is composed of a plurality of air cylinders 823a provided on the supporting flange 822. Each air cylinder 823a is provided with a piston rod 823b connected to the lower surface of the annular frame holding member 811. The driving means 823 composed of these plural air cylinders 823a functions to vertically move the annular frame holding member 811 so as to selectively take a reference position where the mounting surface 811a is substantially equal in height to the upper end of the expanding drum 821 as shown in FIG. 11A and an expansion position where the mounting surface 811a is lower in height than the upper end of the expanding drum 821 by a predetermined amount as shown in FIG. 11B.

The pickup step using the pickup apparatus 8 will now be described with reference to FIGS. 11A to 11C. As shown in FIG. 11A, the annular frame F supporting the semiconductor wafer 2 through the dicing tape T (the semiconductor wafer 2 having been divided into the individual devices 22 along the streets 21) is mounted on the mounting surface 811a of the frame holding member 811 of the frame holding means 81 and fixed to the frame holding member 811 by the clamps 812. At this time, the frame holding member 811 is set at the reference position shown in FIG. 11A. Thereafter, the air cylinders 823a as the driving means 823 of the tape expanding means 82 are operated to lower the frame holding member 811 to the expansion position shown in FIG. 11B. Accordingly, the annular frame F fixed to the mounting surface 811a of the frame holding member 811 is also lowered, so that the dicing tape T supported to the annular frame F comes into abutment against the upper end of the expanding drum 821 and is expanded as shown in FIG. 11B.

Figure 11B:
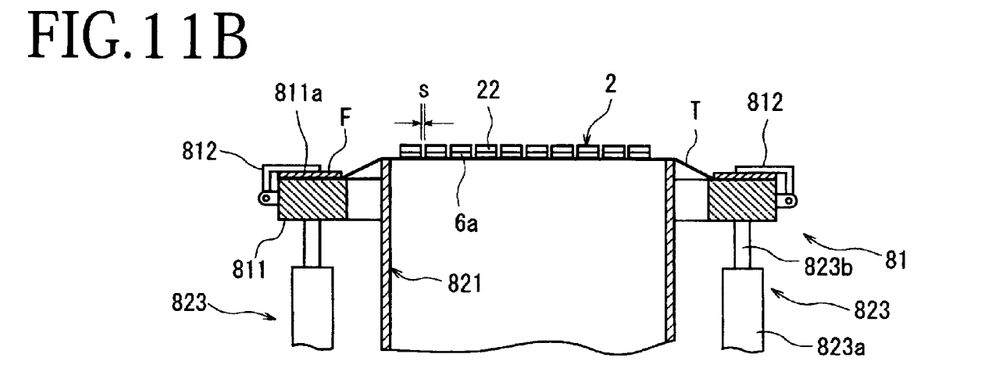
Figure 11C:
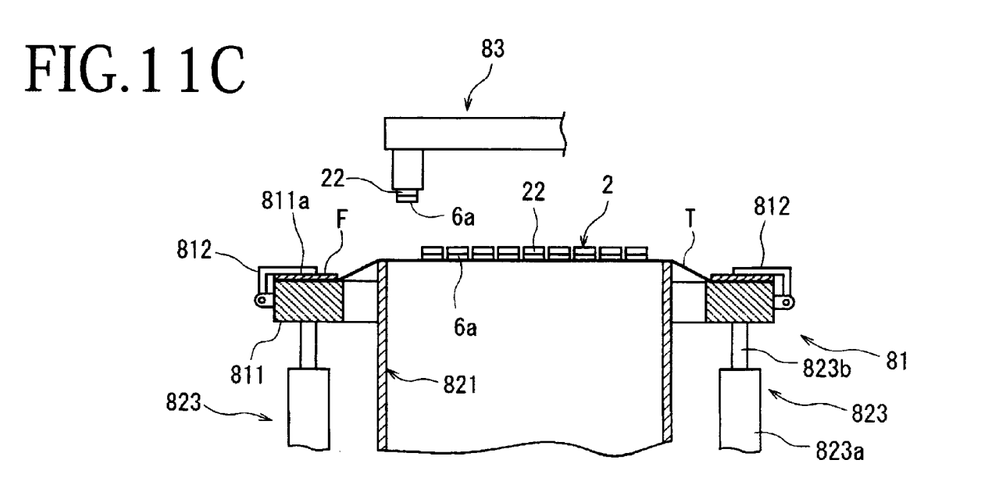

As a result, the spacing S between the adjacent adhesive films 6a attached to the dicing tape T and between the adjacent devices 22 attached to these adjacent adhesive films 6a is increased as shown in FIG. 11B. Thereafter, as shown in FIG. 11C, the pickup collet 83 is operated to hold each device 22 with the accompanying adhesive film 6a by suction and peel it off from the dicing tape T. Each device 22 with the accompanying adhesive film 6a thus picked up by the pickup collet 83 is transported to a tray (not shown) or a die bonding stage. In this pickup step, the spacing S between the adjacent devices 22 with the respective adhesive films 6a is increased, so that each device 22 can be easily picked up without the contact with its adjacent device 22.

The individual adhesive films 6a are attached to the dicing tape T supported to the annular frame F after the adhesive film dividing step. Accordingly, there is no possibility that the adhesive films 6a may adhere to the dicing tape T, so that each device 22 with the accompanying adhesive film 6a can be easily peeled off from the dicing tape T in the pickup step.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A device fabrication method for dividing a wafer into individual devices along a plurality of crossing streets formed on a front side of said wafer, wherein said devices are respectively formed in a plurality of regions partitioned by said streets and a back side of each device is covered with an adhesive film for die bonding, said device fabrication method comprising:
    a kerf forming step of cutting the front side of said wafer along said streets by using a cutting blade to thereby form a plurality of kerfs along said streets, each kerf having a depth corresponding to the finished thickness of each device;
    a protective tape attaching step of attaching a protective tape to the front side of said wafer after performing said kerf forming step;
    a wafer dividing step of grinding a back side of said wafer to expose each kerf to the back side of said wafer after performing said protective tape attaching step, thereby dividing said wafer into said individual devices;
    an adhesive film mounting step of mounting an adhesive film on the back side of said wafer after performing said wafer dividing step;
    an adhesive film dividing step of applying a laser beam to said adhesive film along said kerfs after performing said adhesive film mounting step, thereby dividing said adhesive film along said kerfs;
    a wafer supporting step of attaching said adhesive film mounted on the back side of said wafer to a dicing tape supported on an annular frame and peeling off said protective tape from the front side of said wafer after performing said adhesive film dividing step; and
    a pickup step of peeling off each device with the accompanying adhesive film from said dicing tape.

* * * * *